(12) United States Patent
Hsu

(10) Patent No.: US 11,246,223 B2
(45) Date of Patent: Feb. 8, 2022

(54) PACKAGE APPARATUS

(71) Applicant: PHOENIX PIONEER TECHNOLOGY CO., LTD., Hsinchu County (TW)

(72) Inventor: Shih-Ping Hsu, Hsinchu County (TW)

(73) Assignee: PHOENIX PIONEER TECHNOLOGY CO., LTD., Hsinchu County (TW)

(*) Notice: Subject to any disclaimer, the term of this patent is extended or adjusted under 35 U.S.C. 154(b) by 56 days.

(21) Appl. No.: 15/651,073

(22) Filed: Jul. 17, 2017

(65) Prior Publication Data

US 2017/0318683 A1 Nov. 2, 2017

Related U.S. Application Data

(62) Division of application No. 14/458,751, filed on Aug. 13, 2014, now Pat. No. 9,750,142.

(30) Foreign Application Priority Data

Mar. 28, 2014 (TW) ................................ 103111780

(51) Int. Cl.
*H05K 5/00* (2006.01)
*H05K 3/32* (2006.01)
(Continued)

(52) U.S. Cl.
CPC ............. *H05K 3/32* (2013.01); *H01L 21/486* (2013.01); *H01L 21/4857* (2013.01); *H01L 23/49822* (2013.01); *H01L 23/49827* (2013.01); *H01L 23/562* (2013.01); *H01L 24/81* (2013.01); *H01L 23/3128* (2013.01); *H01L 2224/18* (2013.01); *H01L 2924/00* (2013.01); *H01L 2924/12042* (2013.01); *H01L 2924/181* (2013.01);
(Continued)

(58) Field of Classification Search
CPC .... H05K 1/185; H05K 2201/10; H05K 1/162; H05K 2201/10007; H05K 2201/10015; H05K 2201/10022; H05K 2201/1003; H05K 2201/10037; H05K 3/284
USPC .................................................. 361/760–764
See application file for complete search history.

(56) References Cited

U.S. PATENT DOCUMENTS 5,169,680 A 12/1992 Ting et al.
6,356,453 B1 * 3/2002 Juskey .................. H01L 21/561
257/724
(Continued)

FOREIGN PATENT DOCUMENTS

TW 201209983 3/2012

*Primary Examiner* — Binh B Tran
(74) *Attorney, Agent, or Firm* — WPAT, PC

(57) ABSTRACT

A package apparatus comprises a first wiring layer, a first dielectric material layer, a first conductive pillar layer, a first buffer layer, a second wiring layer, and a protection layer. The first wiring layer has a first surface and a second surface opposite to the first surface. The first dielectric material layer is disposed within partial zone of the first wiring layer. The first conductive pillar layer is disposed on the second surface of the first wiring layer. The first buffer layer is disposed within partial zone of the first conductive pillar layer. The second wiring layer is disposed on the first buffer layer and one end of the first conductive pillar layer. The protection layer is disposed on the first buffer layer and the second wiring layer.

14 Claims, 17 Drawing Sheets

(51) Int. Cl.
*H01L 23/00* (2006.01)
*H01L 23/498* (2006.01)
*H01L 21/48* (2006.01)
H01L 23/31 (2006.01)
H05K 3/46 (2006.01)

(52) U.S. Cl.
CPC ......... *H05K 3/4682* (2013.01); *Y10T 29/4913* (2015.01); *Y10T 29/49162* (2015.01)

(56) References Cited

U.S. PATENT DOCUMENTS

| | | | |
|---|---|---|---|
| 7,750,483 B1* | 7/2010 | Lin | H01L 24/29 |
| | | | 257/778 |
| 8,039,756 B2 | 10/2011 | Kikuchi et al. | |
| 8,709,874 B2 | 4/2014 | Chew et al. | |
| 2007/0164449 A1* | 7/2007 | Wang | H01L 24/16 |
| | | | 257/778 |
| 2011/0194265 A1* | 8/2011 | Su | H01L 23/49827 |
| | | | 361/761 |
| 2011/0241203 A1* | 10/2011 | Nakasato | H01L 21/563 |
| | | | 257/737 |
| 2012/0058604 A1 | 3/2012 | Chew et al. | |

* cited by examiner

PACKAGE APPARATUS

FIELD OF THE INVENTION

The present invention relates to a package apparatus and manufacturing method thereof, and more particularly, to a semiconductor package apparatus and method for manufacturing the same.

BACKGROUND OF THE INVENTION

With the design trend in electronic devices is toward lighter, smaller, thinner but more functional devices with performance requirements continuing to increase, device manufacturers increasingly need specialty integrated circuit (IC) solutions for allowing billions of miniature electronic components to be densely packed in a small area. Thus, device manufacturers come up with innovative packaging techniques for embedding electronic components in a substrate while allowing shorter traces between the electronic components and the substrate. In addition, the layout area is increased by the use of built-up technique as the technology advances for achieving lighter, smaller, thinner and more functional high-performance devices.

Generally, most high-end chips are packaged by flip chip (FC) process, especially by a chip scale package (CSP) process, as those high-end chips are primarily being applied in smart phones, tablet computers, network communication devices, and notebook computers, whichever is generally operating under high-frequency and high-speed condition and required to be packed in a thin, small and light-weighted semiconductor package. As for the carrier for packaging, the popular design nowadays includes: small pitches between lines, high density, thin-type design, low manufacture cost, and high electrical characteristic.

Please refer to FIG. 1, which shows a conventional fiberglass substrate packaging structure. In FIG. 1, the fiberglass substrate packaging structure 10 has a fiberglass substrate 100, which can be made of a bismaleimide triazine (BT) substrate or FR-5 substrate. In addition, the fiberglass substrate 100 is formed with a groove 110 and a plurality of via holes 120 by a laser via method, by that the groove 110 can be used for receiving and holding an electronic component 130, while a portion of the plural via holes 120 can be provided for receiving a conductive metal pillar 140. As shown in FIG. 1, the two first conductive metal layers 142, 144 are respectively disposed on the fiberglass substrate 100 while allowing the two to connected electrically to the conductive metal pillar 140; the groove 110 and the electronic component 130 are covered and sealed by an insulation layer 150, whereas the electronic component 130, the plural via holes 120, two second conductive metal layers 146, 148 to be disposed on the insulation layer 150 while being connected electrically to the electronic component 130 and the two first conductive metal layers 142, 144.

However, the aforesaid conventional fiberglass substrate packaging structure is disadvantageous in that: it can be very costly for using a fiberglass substrate as its substrate in addition to that the thin-type fiberglass substrate can be easily deformed and wrapped, and the conventional substrate including fiberglass will increase the difficulty of processing for laser via so that it cannot fit the need of fine pitch therefore make the wiring more troublesome; and as the blind/buried vias in the aforesaid four-layered metal laminated structure are formed by the repetition of a laser via method, such repetition can be a complex and time consuming process and also the cost for fabricating the four-layered metal laminated structure can be costly. Therefore, the aforesaid conventional fiberglass substrate packaging structure does not have industrial advantages.

Please refer to FIG. 2, which shows a conventional molding compound substrate packaging structure. As shown in FIG. 2, the molding compound substrate packaging structure 20 includes: a first wiring layer 200, a metal layer 210, a pillar conductive layer 220, a molding compound layer 230, a second wiring layer 240, and a protection layer 250. In which the first wiring layer 200 has a top surface and a bottom surface that are arranged opposite to each other; the metal layer 210 is disposed on the bottom surface of the first wiring layer 200; the pillar conductive layer 220 is disposed on the top surface of the first wiring layer 200; the molding compound layer 230 is disposed on the first wiring layer 200 and the pillar conductive layer 220 without having the molding compound layer 230 to be exposed out of the bottom surface of the first wiring layer 200 and one end of the pillar conductive layer 220; the second wiring layer 240 is disposed on the molding compound layer 230 and one end of the pillar conductive layer 220; the protection layer 250 is disposed on the molding compound layer 230 and the second wiring layer 240.

Since the aforesaid conventional molding compound substrate packaging structure is made of a molding compound material and the electrical connection between the plural wiring layers formed therein is achieved by the conduction of the pillar conductive layer instead of the laser via holes on the aforesaid fiberglass substrate packaging structure, the molding compound substrate packaging structure can have better rigidity than the fiberglass substrate by that it is less likely to deform and wrap than the fiberglass substrate. However, the good rigidity of such molding compound substrate can come with a cost that it is easy to crack and break into pieces, causing irretrievable problems of poor reliability and interruption in electrical connection which can be especially severe for thin-type molding compound substrates. In addition, as the pillar conductive layer for such molding compound substrate is formed directly on the bonding pads of its first wiring layer occupying the space of substrate, it might not be applied for products of fine pitch design, and also for those products with stacking structure, their manufacturing process can be difficult and costly since there can be more than one pillar conductive layer while the pillar in each pillar conductive layer will be required to be formed thinner and thinner.

SUMMARY OF THE INVENTION

The present invention provides a package apparatus, by which a molding compound layer and a dielectric layer can be used as the major material in the manufacturing of a coreless substrate, and a Molded Interconnection System (MIS) as well as an electrical connection using plating pillar conductive layer are achieved during the substrate manufacturing process. Thereby, a thin-type stacking structure with good rigidity can be achieved.

The present invention provides a method for manufacturing a package apparatus, using which not only a less expensive substrate of molding compound material and dielectric material can be used for replacing the costly conventional fiberglass substrate, but also the conventional expensive and time consuming laser blind/buried hole formation process can be replaced by a faster and simpler electroplating conductive pillar process. The process is simple and the time for processing is shorter.

In a first embodiment, the present invention provides a package apparatus, which comprises: a first wiring layer, a first dielectric material layer, a first conductive pillar layer, a first buffer layer, a second wiring layer, and a protection layer. The first wiring layer has a first surface and a second surface opposite to the first surface. The first dielectric material layer is disposed on the part of the zone of the first wiring layer. The first conductive pillar layer is disposed on the second surface of the first wiring layer. The first buffer layer is disposed within the part of the zone of the first wiring layer. The second wiring layer is disposed on the first buffer layer and one end of the first conductive pillar layer. The protection layer is disposed on the first buffer layer and the second wiring layer. The protection layer is a solder resist layer, a photo-sensitive dielectric material layer, or a non-photo-sensitive dielectric material layer.

Corresponding to the first embodiment, the present invention provides a method for manufacturing a package apparatus, which comprises the steps of: providing a metal carrier composed of a first side and a second side that are arranged opposite to each other; forming a first dielectric material layer on the second side of the metal carrier; forming a first wiring layer on the second side of the metal carrier while allowing the first dielectric material layer to be disposed within a specific portion of the first wiring layer; forming a first conductive pillar layer on the first wiring layer; forming a first buffer layer covering the first dielectric material layer, the first wiring layer, the first conductive pillar layer and the second side of the metal carrier; enabling one end of the first conductive pillar layer to be exposed; forming a second wiring layer on the first buffer layer and the exposed end of the first conductive pillar layer; forming a protection layer on the first buffer layer and the second wiring layer; and removing the metal carrier.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 3A:
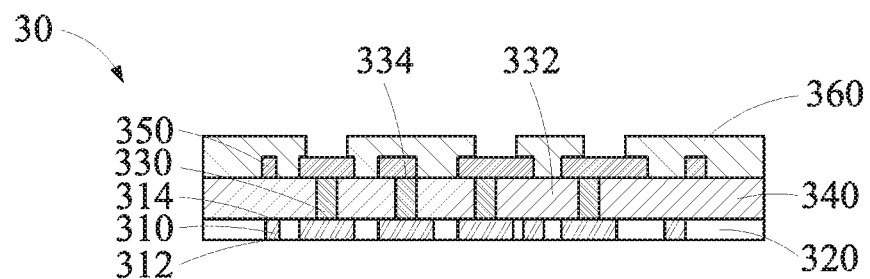
FIG. 3A is a schematic diagram showing a package apparatus according to a first embodiment of the present invention.

Please refer to FIG. 3A, which is a schematic diagram showing a package apparatus according to a first embodiment of the present invention. In the embodiment shown in FIG. 3A, the package apparatus 30 comprises: a first wiring layer 310, a first dielectric material layer 320, a first conductive pillar layer 330, a first buffer layer 340, a second wiring layer 350, and a protection layer 360, in which the first wiring layer 310 is configured with a first surface 312 and a second surface in a manner that the first surface 312 is disposed opposite to the second surface 314. In an embodiment, the first wiring layer 310 can be a wiring layer with patterns which includes at least one wire and a chip seat. The first dielectric material layer 320 is disposed within a specific portion of the first wiring layer 310 in a manner that the first dielectric material layer 320 is or is not to be exposed out of the first surface 312 of the first wiring layer 310 while being positioned lower or not lower than the second surface 314 of the first wiring layer 310, whereas the first dielectric material layer 320 can be made of a material selected from the group consisting of: a resin, a silicon nitride material and a silicon oxide material. In this embodiment, the first dielectric material layer 320 is made of a resin. The first conductive pillar layer 330 is disposed on the second surface 314 of the first wiring layer 310. In this embodiment, the line width of the first conductive pillar layer 33 is smaller than the line width of the first wiring layer 310, and the first conductive pillar layer is substantially a pillar conductive layer, but it is not limited thereby. The first buffer layer 340 is disposed within a specific portion 332 of the first conductive pillar layer 330, while allowing the first buffer layer 340 to be or not to be exposed out of one end 334 of the first conductive pillar layer 330. In this embodiment, the first buffer layer 340 is formed covering on every portion of the first conductive pillar layer 330, but it is not limited thereby. Moreover, the first buffer layer 340 can be made of a molding compound material for chip packaging selected from the group consisting of: a novolac-based resin, an epoxy-based resin, a silicon-based resin and other molding compounds. The second wiring layer 350 is disposed on the first buffer layer 340 and the one end 334 of the first conductive pillar layer 330. In this embodiment, the second wiring layer 350 can be a wiring layer with patterns which includes at least one wire and a chip seat. The protection layer 360 is disposed on the first buffer layer 340 and the second wiring layer 350.

Figure 3B:
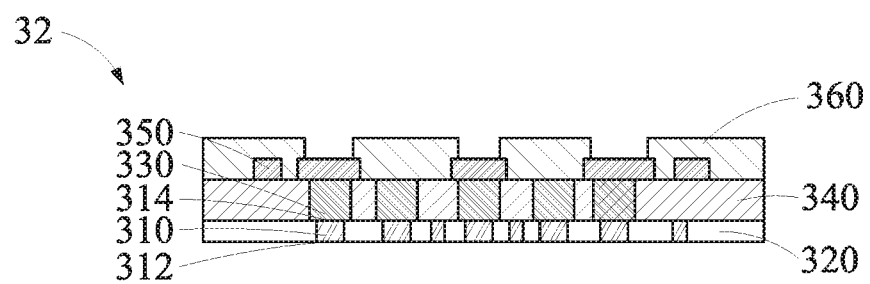
FIG. 3B is a schematic diagram showing a package apparatus according to a second embodiment of the present invention.

FIG. 3B is a schematic diagram showing a package apparatus according to a second embodiment of the present invention. The package apparatus 32 shown in FIG. 3B is basically formed the same as the package apparatus 30 of the first embodiment, but is different in that: the line width of the first conductive pillar layer 330 in the package apparatus 32 is larger than the line width of the first wiring layer 310, but is not limited thereby.

Figure 3C:
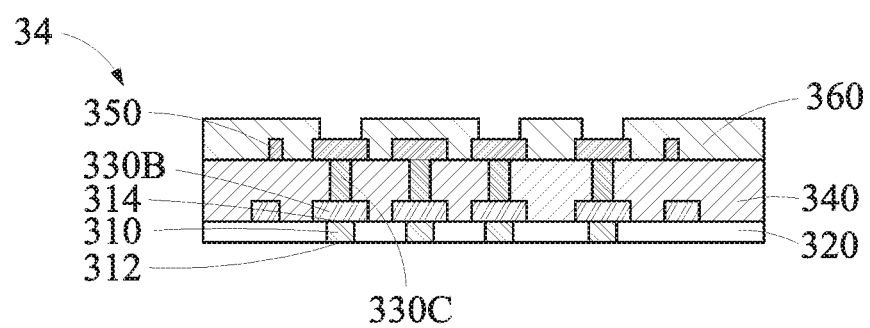
FIG. 3C is a schematic diagram showing a package apparatus according to a third embodiment of the present invention.

FIG. 3C is a schematic diagram showing a package apparatus according to a third embodiment of the present invention. The package apparatus 34 shown in FIG. 3C is basically formed the same as the package apparatus 30 of the first embodiment, but is different in that: in the package apparatus 34, the first conductive pillar layer 330 in the package apparatus 30 is replaced by a second conductive layer 330B and a third conductive layer 330C, whereas the second conductive layer 330B is disposed on the first wiring layer 310 and the first dielectric material layer 320, and the third conductive layer 330C is disposed at a position between the second conductive layer 330B and the second wiring layer 350.

Figure 1:
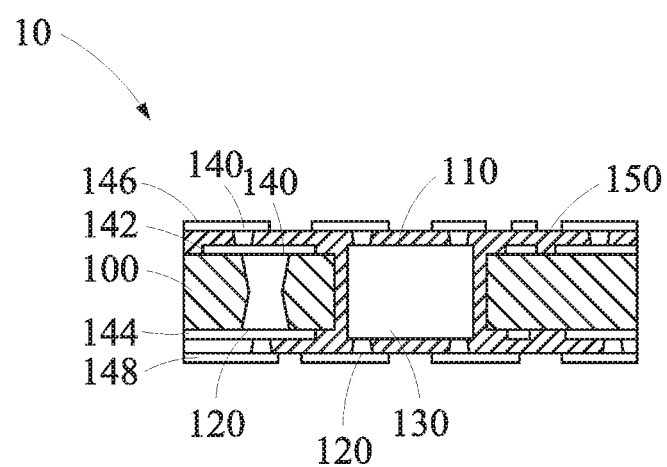
FIG. 1 shows a conventional fiberglass substrate packaging structure.

It is noted that comparing to the conventional package apparatus of fiberglass substrate 10 shown in FIG. 1, the package apparatuses 30, 32, 34 in the first, second and third embodiments all employ a molding compound layer and a dielectric material layer as the major material in the manufacturing of a coreless substrate, and therefore not only a less expensive molding compound substrate can be used for replacing the costly conventional fiberglass substrate, but also the conventional expensive and time consuming laser blind/buried hole formation process on four-layered structure can be replaced by a faster and simpler electroplating conductive process on less costly two-layered structure.

Figure 2:
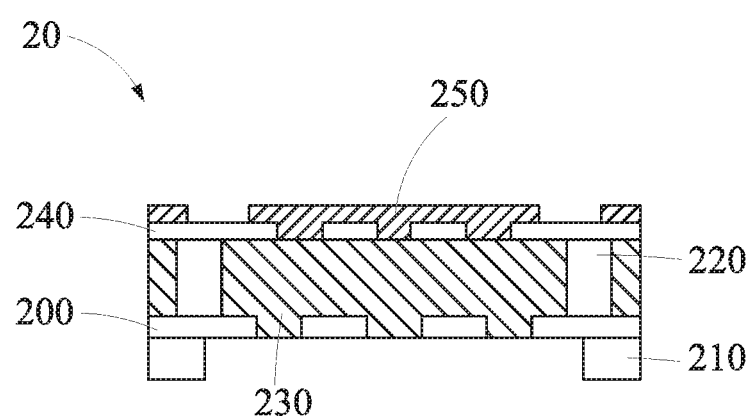
FIG. 2 shows a conventional molding compound substrate packaging structure.

In addition, comparing to the conventional molding compound substrate packaging structure 20 shown in FIG. 2, the package apparatuses 30, 32, 34 all employ both a molding compound layer and a dielectric material layer at the same time as the major material in the manufacturing of a coreless substrate, so that the shortcoming of easy-to-crack and break-into-pieces due to high rigidity that troubles the conventional molding compound substrate packaging structure without the dielectric material layer can be avoided, and moreover, by the use of a molded interconnection system (MIS) as well as an electrical connection using plating pillar conductive layer that are achieved during the substrate manufacturing process, a thin-type stacking structure with good rigidity can be achieved.

Figure 3D:
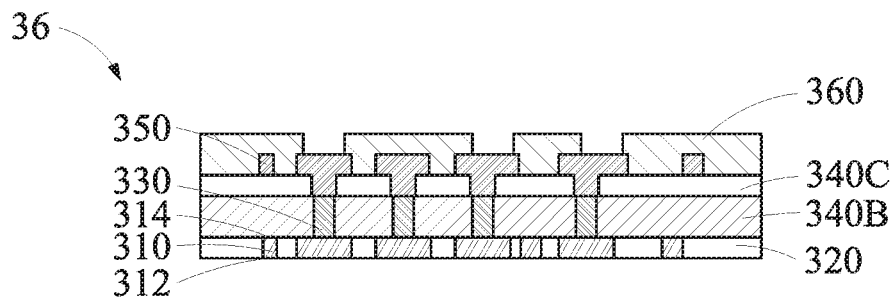
FIG. 3D is a schematic diagram showing a package apparatus according to a fourth embodiment of the present invention.

FIG. 3D is a schematic diagram showing a package apparatus according to a fourth embodiment of the present invention. The package apparatus 36 shown in FIG. 3D is basically formed the same as the package apparatus 30 of the first embodiment, but is different in that: in the package apparatus 36, the first buffer layer 340 in the package apparatus 30 is replaced by a second buffer layer 340B and a third buffer layer 340C, whereas the second wiring layer 350 is disposed on the second buffer layer 340B, the third buffer layer 340C and one end of the first conductive pillar layer 330. In this embodiment, the second buffer layer 340B is made of a molding compound material similar to the one for the first buffer layer 340, and also the third buffer layer 340C is made of a resin similar to the one for the first dielectric material layer 320, but they are not limited thereby.

Figure 3E:
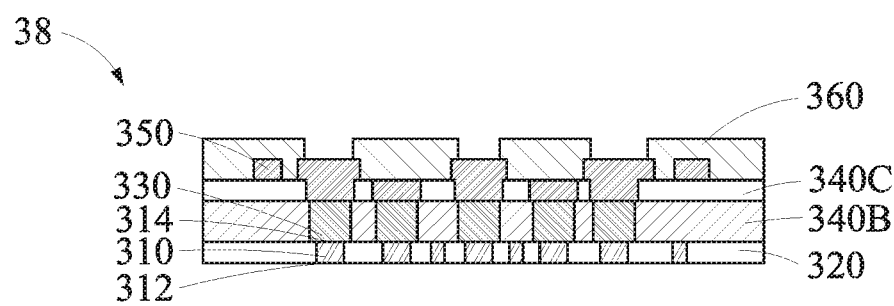
FIG. 3E is a schematic diagram showing a package apparatus according to a fifth embodiment of the present invention.

FIG. 3E is a schematic diagram showing a package apparatus according to a fifth embodiment of the present invention. The package apparatus 38 shown in FIG. 3E is basically formed the same as the package apparatus 36 of the fourth embodiment, but is different in that: the line width of the first conductive pillar layer 330 in the package apparatus 38 is larger than the line width of the first wiring layer 310, but is not limited thereby.

Figure 3F:
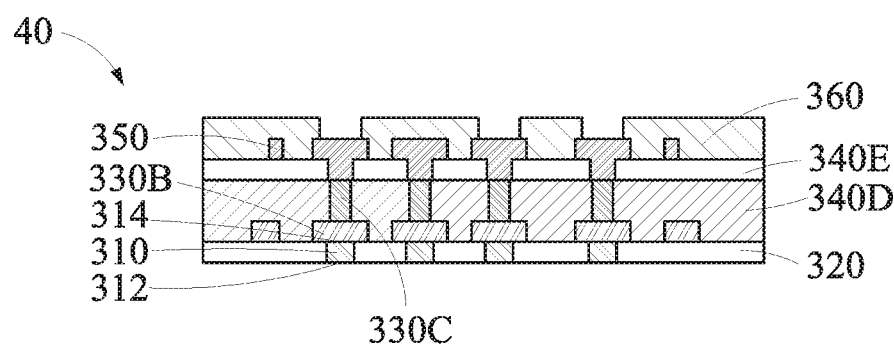
FIG. 3F is a schematic diagram showing a package apparatus according to a sixth embodiment of the present invention.

FIG. 3F is a schematic diagram showing a package apparatus according to a sixth embodiment of the present invention. The package apparatus 40 shown in FIG. 3F is basically formed the same as the package apparatus 34 of the third embodiment, but is different in that: in the package apparatus 40, the first buffer layer 340 in the package apparatus 34 is replaced by a fourth buffer layer 340D and a fifth buffer layer 340E, whereas the second wiring layer 350 is disposed on the fourth buffer layer 340D, the fifth buffer layer 340E and one end of the third conductive layer 330C. In this embodiment, the fourth buffer layer 340D is made of a molding compound material similar to the one for the first buffer layer 340, and also the fifth buffer layer 340E is made of a resin similar to the one for the first dielectric material layer 320, but they are not limited thereby.

In addition, comparing to the aforesaid package apparatuses 30, 32, 34 shown respectively in the first, second and third embodiments, the package apparatuses 36, 38, 40 in the fourth, fifth and sixth embodiments all include an additional layer of second dielectric material layer to be used as the major material in the manufacturing of a coreless substrate, so that not only the shortcoming of easy-to-crack and break-into-pieces due to high rigidity that troubles the conventional molding compound substrate packaging structure can be avoided, but also the stability of the molding compound layer is enhanced by the additional dielectric material layer, adapting the same for the manufacturing process of high-density multi-layered stacking structure of small line-width and small pitch.

Figure 3G:
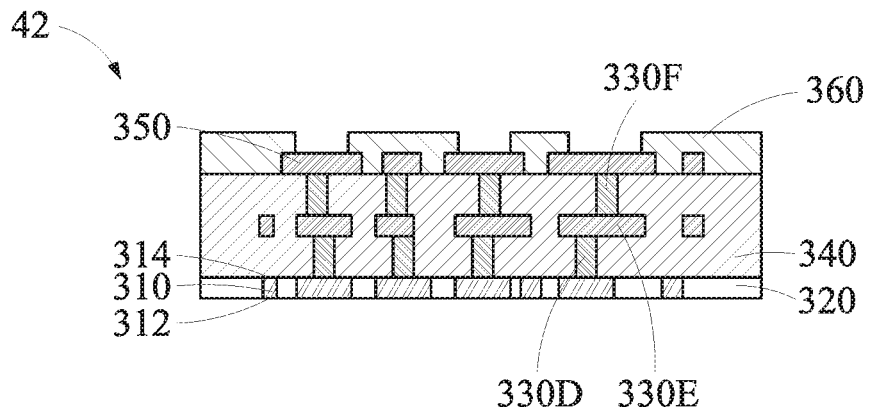
FIG. 3G is a schematic diagram showing a package apparatus according to a seventh embodiment of the present invention.

FIG. 3G is a schematic diagram showing a package apparatus according to a seventh embodiment of the present invention. The package apparatus 42 shown in FIG. 3G is basically formed the same as the package apparatus 30 of the first embodiment, but is different in that: in the package apparatus 42, the first conductive pillar layer 330 in the package apparatus 30 is replaced by a fourth conductive layer 330D, a fifth conductive layer 330E and a sixth conductive layer 330F, whereas the fourth conductive layer 330D is disposed on the first wiring layer 310, the fifth conductive layer 330E is disposed on the fourth conductive layer 330D, and the sixth conductive layer 330F is disposed at a position between the fifth conductive layer 330E and the second wiring layer 350. In this embodiment, the fourth conductive layer 330D and the sixth conductive layer 330F are respectively made similar to the pillar conductive layer of the first conductive pillar layer 330, and also the fifth conductive layer 330E is made similar to the wirings of the first wiring layer 310, but they are not limited thereby.

Figure 3H:
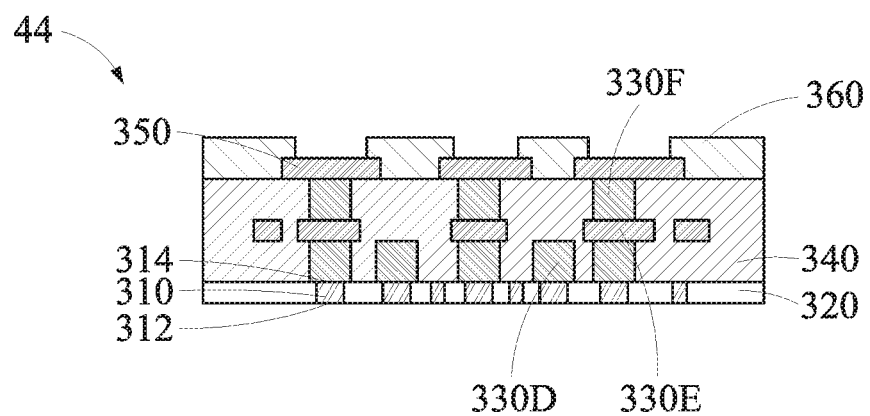
FIG. 3H is a schematic diagram showing a package apparatus according to an eighth embodiment of the present invention.

FIG. 3H is a schematic diagram showing a package apparatus according to an eighth embodiment of the present invention. The package apparatus 44 shown in FIG. 3H is basically formed the same as the package apparatus 42 of the seventh embodiment, but is different in that: the line width of the fourth conductive layer 330D in the package apparatus 44 is larger than the line width of the first wiring layer 310, but is not limited thereby.

Figure 3I:
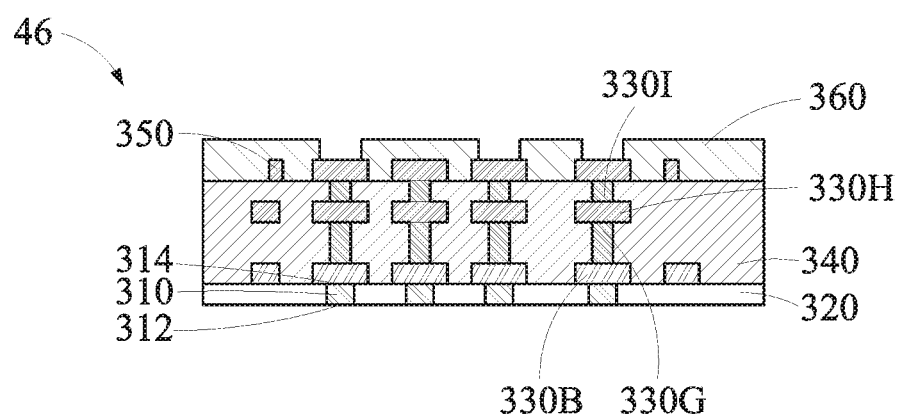
FIG. 3I is a schematic diagram showing a package apparatus according to a ninth embodiment of the present invention.

FIG. 3I is a schematic diagram showing a package apparatus according to a ninth embodiment of the present invention. The package apparatus 46 shown in FIG. 3I is basically formed the same as the package apparatus 34 of the third embodiment, but is different in that: in the package apparatus 34, the third conductive layer 330C in the package apparatus 34 is replaced by a seventh conductive layer 330G, an eighth conductive layer 330H and a ninth conductive layer 330I, whereas the seventh conductive layer 330G is disposed on the second conductive layer 330B, the eighth conductive layer 330H is disposed on the seventh conductive layer 330G, and the ninth conductive layer 330I is disposed at a position between the eighth conductive layer 330H and the second wiring layer 350. In this embodiment, the seventh conductive layer 330G and the ninth conductive layer 330I are respectively made similar to the pillar conductive layer of the first conductive pillar layer 330, and also the eighth conductive layer 330H is made similar to the wirings of the first wiring layer 310, but they are not limited thereby.

In addition, comparing to the aforesaid package apparatuses 30, 32, 34 shown respectively in the first, second and third embodiments, the package apparatuses 42, 44, 46 in the seventh, eighth and ninth embodiments all include an additional layer of second wiring layer, so that the shortcoming of easy-to-crack and break-into-pieces due to high rigidity that troubles the coreless substrate of single molding compound layer without the use of dielectric material layer can be avoided, and also the stability of the molding compound layer is enhanced by the additional dielectric material layer, adapting the same for the manufacturing process of high-density multi-layered stacking structure of small line-width and small pitch.

Figure 3J:
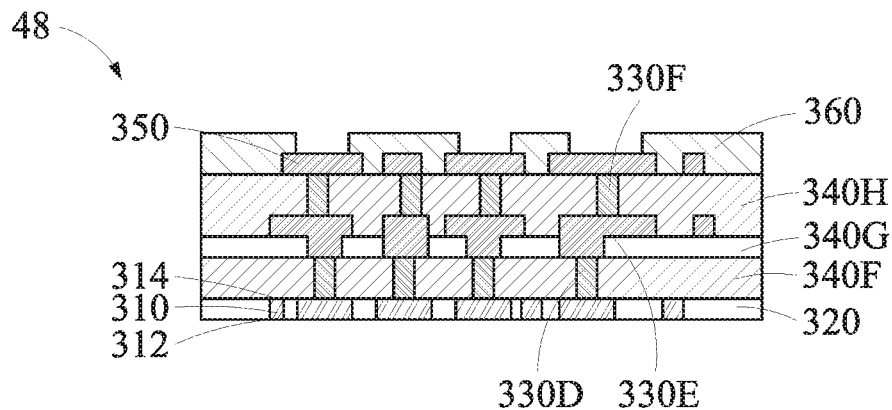
FIG. 3J is a schematic diagram showing a package apparatus according to a tenth embodiment of the present invention.

FIG. 3J is a schematic diagram showing a package apparatus according to a tenth embodiment of the present invention. The package apparatus 48 shown in FIG. 3J is basically formed the same as the package apparatus 42 of the seventh embodiment, but is different in that: in the package apparatus 48, the first buffer layer 340 in the package apparatus 42 is replaced by a sixth buffer layer 340F, a seventh buffer layer 340G, and an eighth buffer layer 340H, whereas the fifth conductive layer 330E is disposed on the sixth buffer layer 340F, the seventh buffer layer 340G and one end of the fourth conductive layer 330D, and the second wiring layer 350 is disposed on the eighth buffer layer 340H and one end of the sixth conductive layer 330F. In this embodiment, the sixth buffer layer 340F and the eighth buffer layer 340H are respectively made of a molding compound material similar to the first buffer layer 340, and also the seventh buffer layer 340G is made of a resin similar to the first dielectric material layer 320, but they are not limited thereby.

Figure 3K:
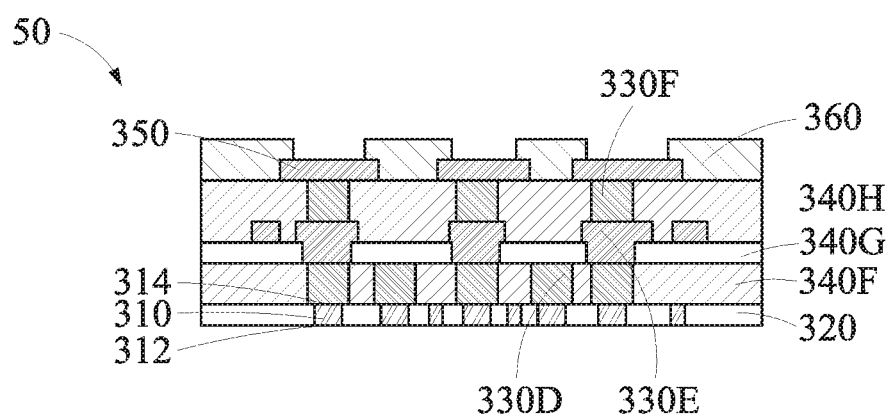
FIG. 3K is a schematic diagram showing a package apparatus according to an eleventh embodiment of the present invention.

FIG. 3K is a schematic diagram showing a package apparatus according to an eleventh embodiment of the present invention. The package apparatus 50 shown in FIG. 3K is basically formed the same as the package apparatus 48 of the tenth embodiment, but is different in that: the line width of the fourth conductive layer 330D in the package apparatus 50 is larger than the line width of the first wiring layer 310, but is not limited thereby.

Figure 3L:
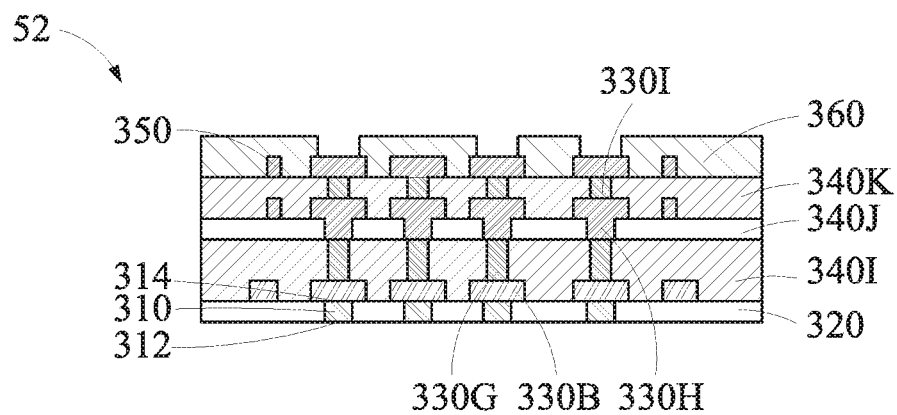
FIG. 3L is a schematic diagram showing a package apparatus according to a twelfth embodiment of the present invention.

FIG. 3L is a schematic diagram showing a package apparatus according to a twelfth embodiment of the present invention. The package apparatus 52 shown in FIG. 3L is basically formed the same as the package apparatus 46 of the ninth embodiment, but is different in that: in the package apparatus 52, the first buffer layer 340 in the package apparatus 46 is replaced by a ninth buffer layer 340I, a tenth buffer layer 340J, and an eleventh buffer layer 340K, whereas the eighth wiring layer 330H is disposed on the ninth buffer layer 340I, the tenth buffer layer 340J and one end of the seventh conductive layer 330G. In this embodiment, the ninth buffer layer 340I and the eleventh buffer layer 340K are respectively made of a molding compound material similar to the first buffer layer 340, and also the tenth buffer layer 340J is made of a resin similar to the first dielectric material layer 320, but they are not limited thereby.

In addition, comparing to the aforesaid package apparatuses 42, 44, 46 shown respectively in the seventh, eighth and ninth embodiments, the package apparatuses 48, 50, 52 in the tenth, eleventh and twelfth embodiments all include an additional layer of second dielectric material layer to be used as the major material in the manufacturing of a coreless substrate, so that the shortcoming of easy-to-crack and break-into-pieces due to high rigidity that troubles the coreless substrate of single molding compound layer can be avoided, and also the stability of the molding compound layer is enhanced by the additional dielectric material layer, adapting the same for the manufacturing process of high-density multi-layered stacking structure of small line-width and small pitch.

Figure 3M:
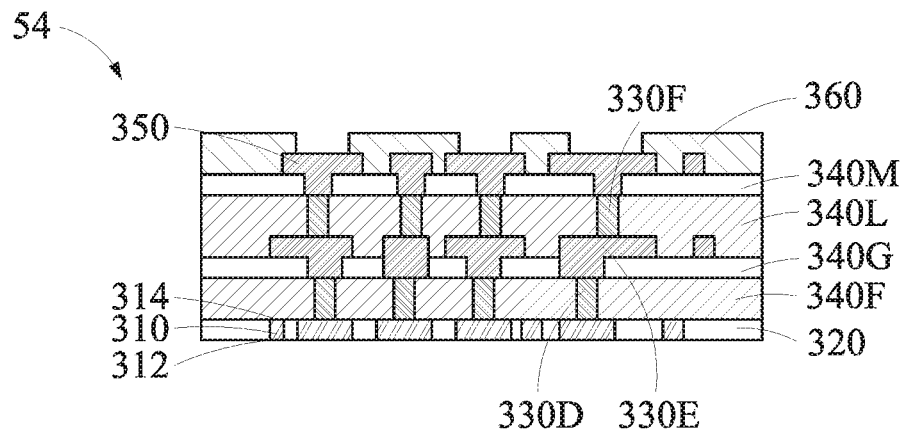
FIG. 3M is a schematic diagram showing a package apparatus according to a thirteenth embodiment of the present invention.

FIG. 3M is a schematic diagram showing a package apparatus according to a thirteenth embodiment of the present invention. The package apparatus 54 shown in FIG. 3M is basically formed the same as the package apparatus 48 of the tenth embodiment, but is different in that: in the package apparatus 54, the eighth buffer layer 340H in the package apparatus 48 is replaced by a twelfth buffer layer 340L, and a thirteenth buffer layer 340M, whereas the second wiring layer 350 is disposed on the twelfth buffer layer 340L, the thirteenth buffer layer 340M and one end of the sixth conductive layer 330F. In this embodiment, the twelfth buffer layer 340L is made of a molding compound material similar to the first buffer layer 340, and also the thirteenth buffer layer 340M is made of a resin similar to the first dielectric material layer 320, but they are not limited thereby.

Figure 3N:
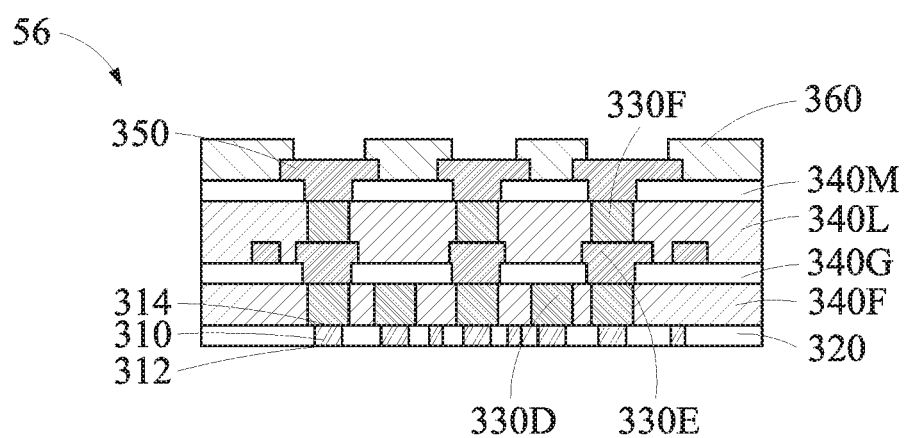
FIG. 3N is a schematic diagram showing a package apparatus according to a fourteenth embodiment of the present invention.

FIG. 3N is a schematic diagram showing a package apparatus according to an fourteenth embodiment of the present invention. The package apparatus 56 shown in FIG. 3N is basically formed the same as the package apparatus 54 of the thirteenth embodiment, but is different in that: the line width of the fourth conductive layer 330D in the package apparatus 56 is larger than the line width of the first wiring layer 310, but is not limited thereby.

Figure 3O:
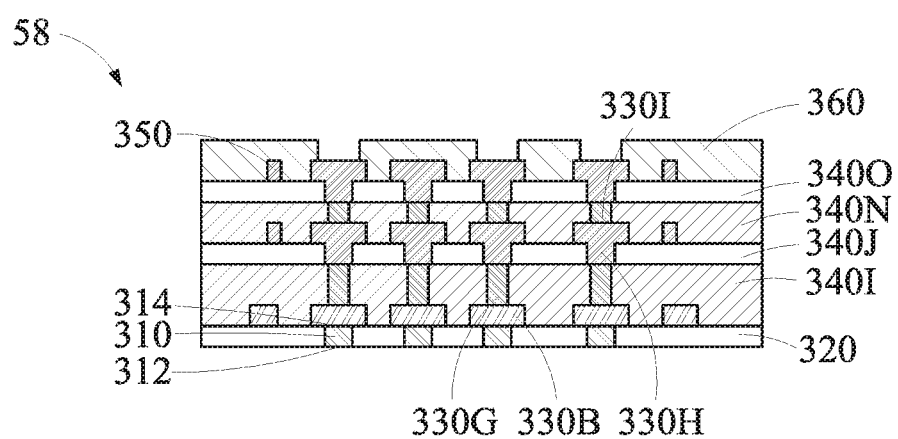
FIG. 3O is a schematic diagram showing a package apparatus according to a fifteenth embodiment of the present invention.

FIG. 3O is a schematic diagram showing a package apparatus according to a fifteenth embodiment of the present invention. The package apparatus 58 shown in FIG. 3O is basically formed the same as the package apparatus 52 of the twelfth embodiment, but is different in that: in the package apparatus 58, the eleventh buffer layer 340K in the package apparatus 52 is replaced by a fourteenth buffer layer 340N, and a fifteenth buffer layer 340O, whereas the second wiring layer 350 is disposed on the fourteenth buffer layer 340N, the fifteenth buffer layer 340O and one end of the ninth conductive layer 330I. In this embodiment, the fourteenth buffer layer 340N is made of a molding compound material similar to the first buffer layer 340, and also the fifteenth buffer layer 340O is made of a resin similar to the first dielectric material layer 320, but they are not limited thereby.

In addition, comparing to the aforesaid package apparatuses 48, 50, 52 in the tenth, eleventh and twelfth embodiments, the package apparatuses 54, 56, 58 in the thirteenth, fourteenth and fifteenth embodiments all include an additional third dielectric material layer to be used as the major material in the manufacturing of a coreless substrate, so that the shortcoming of easy-to-crack and break-into-pieces due to high rigidity that troubles the coreless substrate of single molding compound layer can be avoided, and also the stability of the molding compound layer is enhanced by the additional dielectric material layer, adapting the same for the manufacturing process of high-density multi-layered stacking structure of small line-width and small pitch.

Figure 3P:
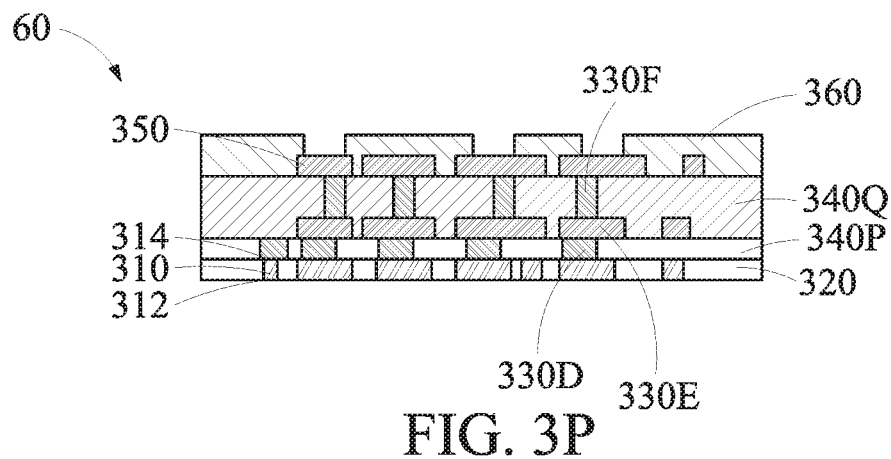
FIG. 3P is a schematic diagram showing a package apparatus according to a sixteenth embodiment of the present invention.

FIG. 3P is a schematic diagram showing a package apparatus according to a sixteenth embodiment of the present invention. The package apparatus 60 shown in FIG. 3P is basically formed the same as the package apparatus 42 of the seventh embodiment, but is different in that: in the package apparatus 60, the first buffer layer 340 in the package apparatus 42 is replaced by a sixteenth buffer layer 340P, and a seventeenth buffer layer 340Q, whereas the fifth conductive layer 330E is disposed on the sixteenth buffer layer 340P and one end of the fourth conductive layer 330D, while the second wiring layer 350 is disposed on the seventeenth buffer layer 340Q and one end of the sixth conductive layer 330F. In this embodiment, the seventeenth buffer layer 340Q is made of a molding compound material similar to the first buffer layer 340, and also the sixteenth buffer layer 340P is made of a resin similar to the first dielectric material layer 320, but they are not limited thereby.

Figure 3Q:
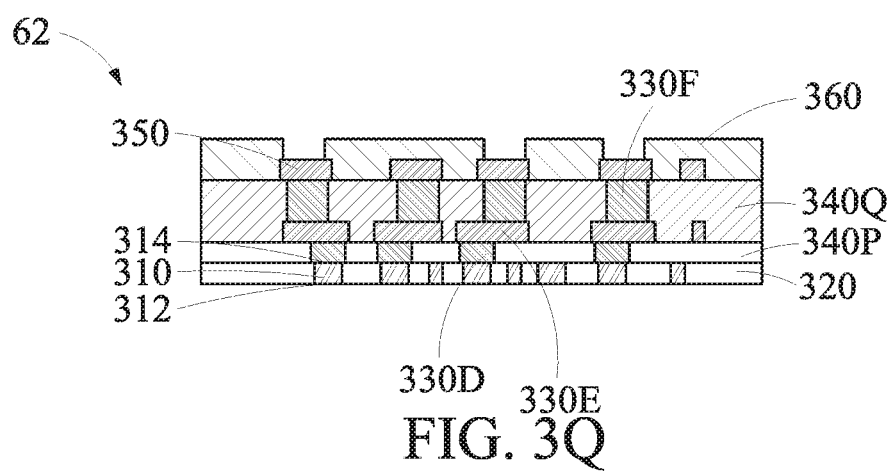
FIG. 3Q is a schematic diagram showing a package apparatus according to a seventeenth embodiment of the present invention.

FIG. 3Q is a schematic diagram showing a package apparatus according to a seventeenth embodiment of the present invention. The package apparatus 62 shown in FIG. 3Q is basically formed the same as the package apparatus 60 of the sixteenth embodiment, but is different in that: the line width of the fourth conductive layer 330D in the package apparatus 62 is larger than the line width of the first wiring layer 310, but is not limited thereby.

Figure 3R:
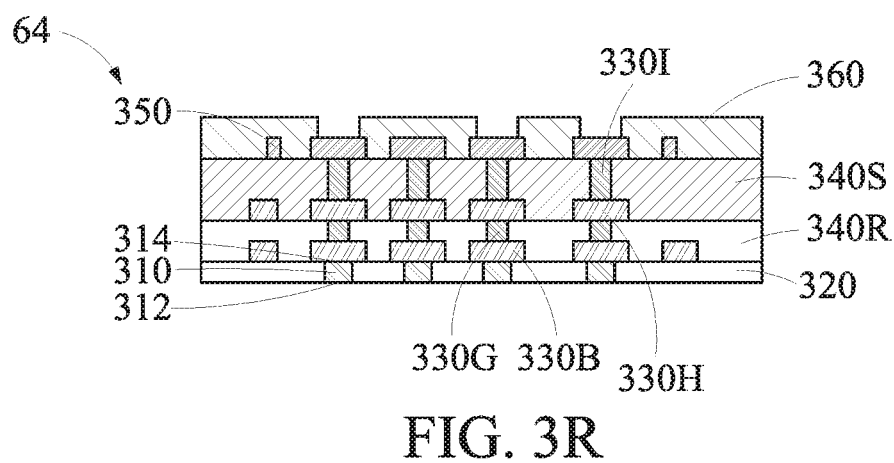
FIG. 3R is a schematic diagram showing a package apparatus according to an eighteenth embodiment of the present invention.

FIG. 3R is a schematic diagram showing a package apparatus according to an eighteenth embodiment of the present invention. The package apparatus 64 shown in FIG. 3R is basically formed the same as the package apparatus 46 of the ninth embodiment, but is different in that: in the package apparatus 64, the first buffer layer 340 in the package apparatus 46 is replaced by an eighteenth buffer layer 340R and a nineteenth buffer layer 340S, whereas the eighth conductive layer 330H is disposed on the eighteenth buffer layer 340R and one end of the seventh conductive layer 330G. In this embodiment, the nineteenth buffer layer 340S is made of a molding compound material similar to the first buffer layer 340, and also the eighteenth buffer layer 340R is made of a resin similar to the first dielectric material layer 320, but they are not limited thereby.

In addition, comparing to the aforesaid package apparatuses 42, 44, 46 shown respectively in the seventh, eighth and ninth embodiments, the package apparatuses 60, 62, 64 in the sixteenth, seventeenth and eighteenth embodiments all include an additional layer of second dielectric material layer to be used as the major material in the manufacturing of a coreless substrate, so that the shortcoming of easy-to-crack and break-into-pieces due to high rigidity that troubles the coreless substrate of single molding compound layer can be avoided, and also the stability of the molding compound layer is enhanced by the additional dielectric material layer, adapting the same for the manufacturing process of high-density multi-layered stacking structure of small line-width and small pitch.

Figure 3S:
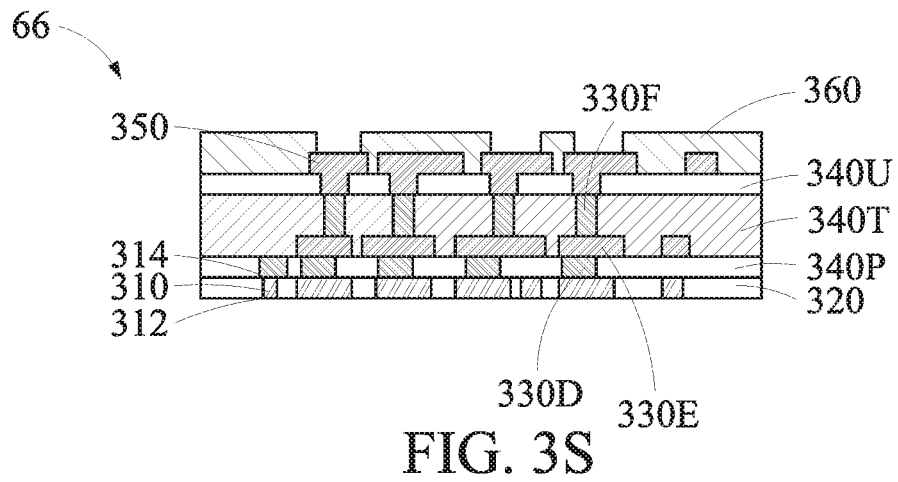
FIG. 3S is a schematic diagram showing a package apparatus according to a nineteenth embodiment of the present invention.

FIG. 3S is a schematic diagram showing a package apparatus according to a nineteenth embodiment of the present invention. The package apparatus 66 shown in FIG. 3S is basically formed the same as the package apparatus 60 of the seventeenth embodiment, but is different in that: in the package apparatus 66, the seventeenth buffer layer 340Q in the package apparatus 60 is replaced by a twentieth buffer layer 340T and a twenty-first buffer layer 340U, whereas the second wiring layer 350 is disposed on the twentieth buffer layer 340T, the twenty-first buffer layer 340U and one end of the sixth conductive layer 330F. In this embodiment, the twentieth buffer layer 340T is made of a molding compound material similar to the first buffer layer 340, and also the twenty-first buffer layer 340U is made of a resin similar to the first dielectric material layer 320, but they are not limited thereby.

Figure 3T:
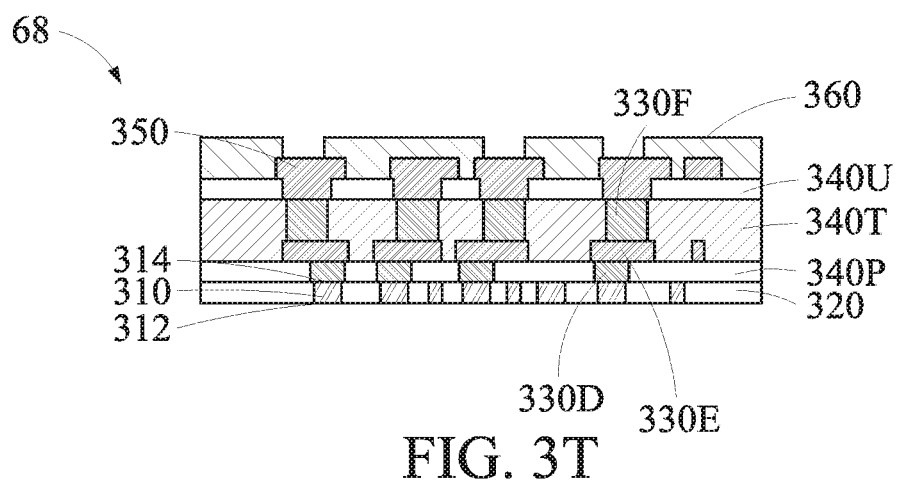
FIG. 3T is a schematic diagram showing a package apparatus according to a twentieth embodiment of the present invention.

FIG. 3T is a schematic diagram showing a package apparatus according to a twentieth embodiment of the present invention. The package apparatus 68 shown in FIG. 3T is basically formed the same as the package apparatus 66 of the nineteenth embodiment, but is different in that: the line width of the fourth conductive layer 330D in the package apparatus 68 is larger than the line width of the first wiring layer 310, but is not limited thereby.

Figure 3U:
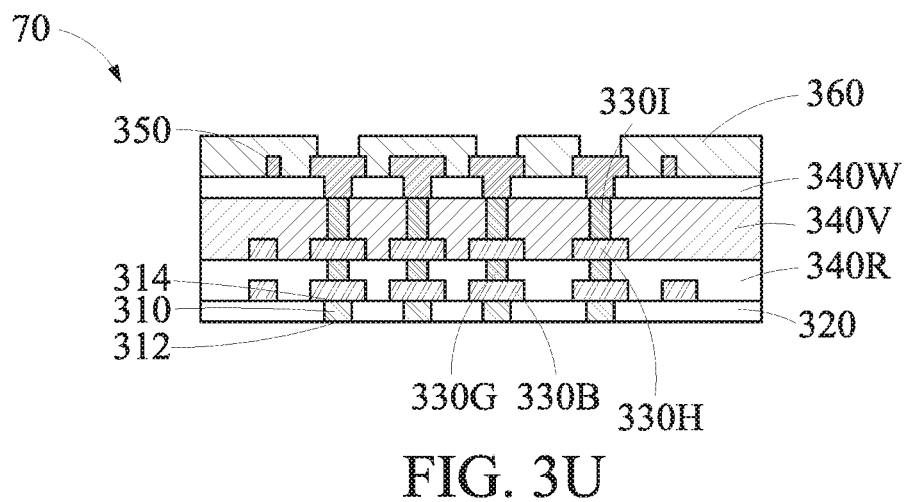
FIG. 3U is a schematic diagram showing a package apparatus according to a twenty-first embodiment of the present invention.

FIG. 3U is a schematic diagram showing a package apparatus according to a twenty-first embodiment of the present invention. The package apparatus 70 shown in FIG. 3U is basically formed the same as the package apparatus 64 of the eighteenth embodiment, but is different in that: in the package apparatus 70, the nineteenth buffer layer 340S in the package apparatus 64 is replaced by a twenty-second buffer layer 340V and a twenty-third buffer layer 340W, whereas the second wiring layer 350 is disposed on the twenty-second buffer layer 340V, the twenty-third buffer layer 340W and one end of the ninth conductive layer 330I. In this embodiment, the twenty-second buffer layer 340V is made of a molding compound material similar to the first buffer layer 340, and also the twenty-third buffer layer 340W is made of a resin similar to the first dielectric material layer 320, but they are not limited thereby.

In addition, comparing to the aforesaid package apparatuses 60, 62, 64 in the sixteenth, seventeenth and eighteenth embodiments, the package apparatuses 66, 68, 70 in the nineteenth, twentieth and twenty-first embodiments all include an additional third dielectric material layer to be used as the major material in the manufacturing of a coreless substrate, so that the shortcoming of easy-to-crack and break-into-pieces due to high rigidity that troubles the coreless substrate of single molding compound layer can be avoided, and also the stability of the molding compound layer is enhanced by the additional dielectric material layer, adapting the same for the manufacturing process of high-density multi-layered stacking structure of small line-width and small pitch.

Figure 4:
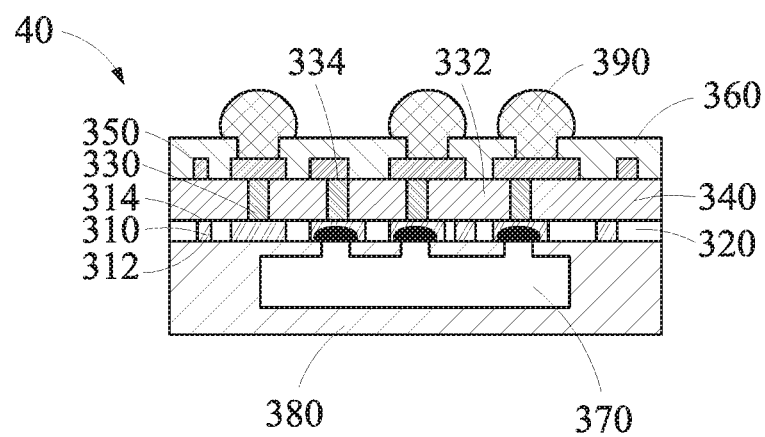
FIG. 4 is a schematic diagram showing a posterior package apparatus of the first embodiment of the present invention.

FIG. 4 is a schematic diagram showing a posterior package apparatus of the first embodiment of the present invention. As shown in FIG. 4, comparing to the previously achieved package apparatus 30, the posterior package apparatus 40 further comprises: an external component 370, disposed on and electrically connected to the first surface 312 of the first wiring layer 310; an external molding compound layer 380, disposed on the external component 370 and the first surface 312 of the first wiring layer 310; and a plurality of conductive elements 390, disposed on the second wiring layer 350. In an embodiment, the external component 370 can be a unit selected from the group consisting of: an active component, a passive element, a semiconductor chip and a flexible circuitboard, but is not limited thereby. It is noted that all the other package apparatuses 32~70 can be configured with those additional components 370, 380, and 390 that are similar to the package apparatus 30, and thus will not be described further herein.

Figure 5:
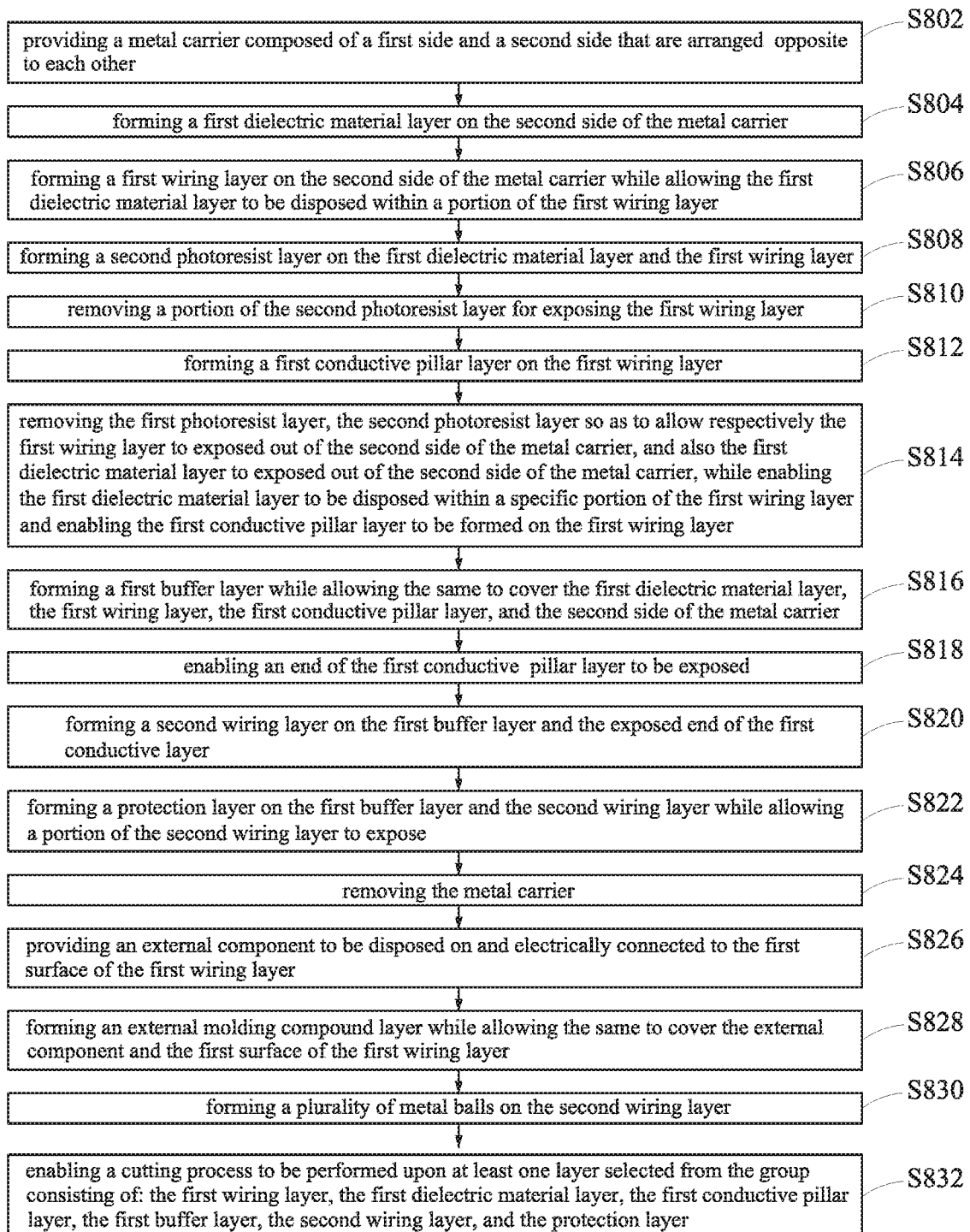
FIG. 5 is a flow chart depicting steps performing in a method for manufacturing a package apparatus of the first embodiment.
Figure 6A:
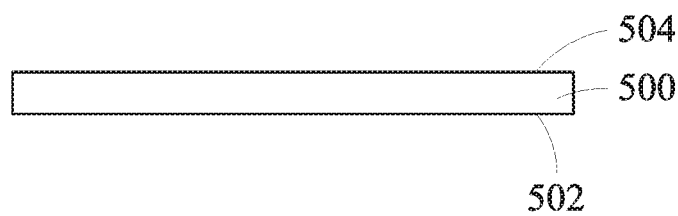
FIG. 6A to FIG. 6P are schematic diagrams illustrating the manufacturing of a package apparatus of the first embodiment.
Figure 6B:
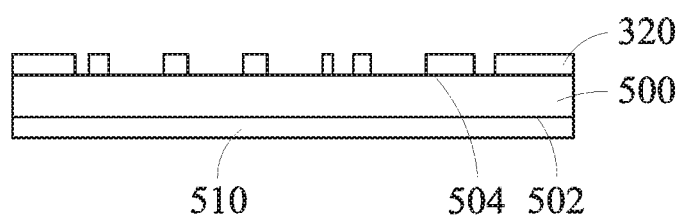
Figure 6C:
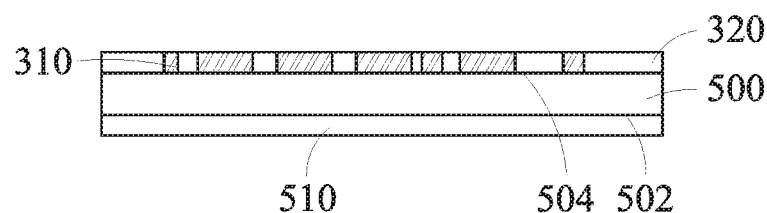
Figure 6D:
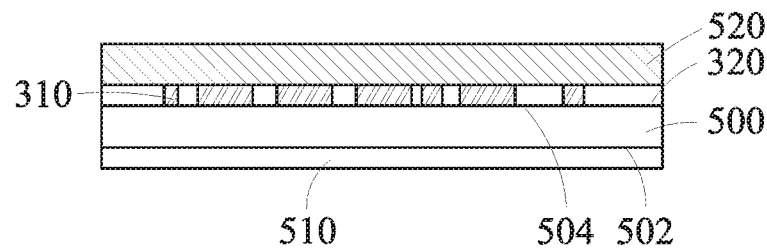
Figure 6E:
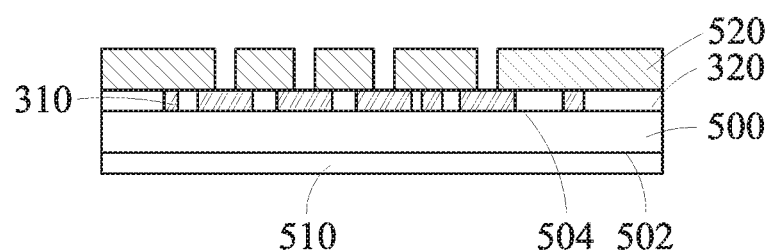
Figure 6F:
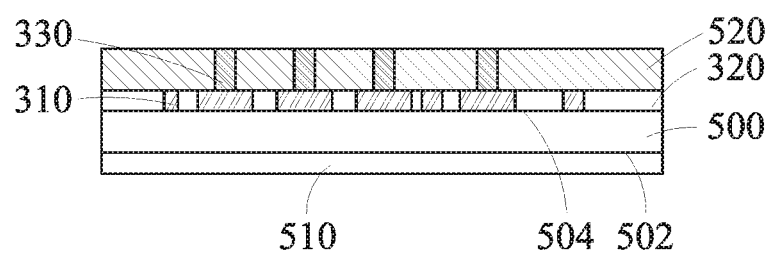
Figure 6G:
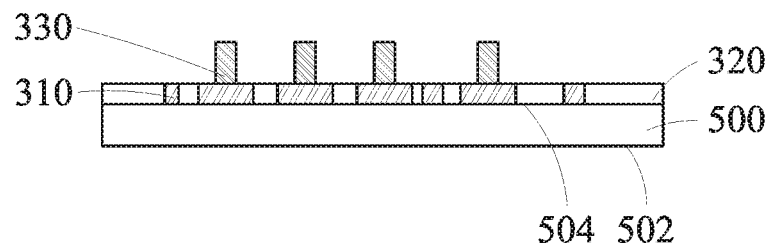
Figure 6H:
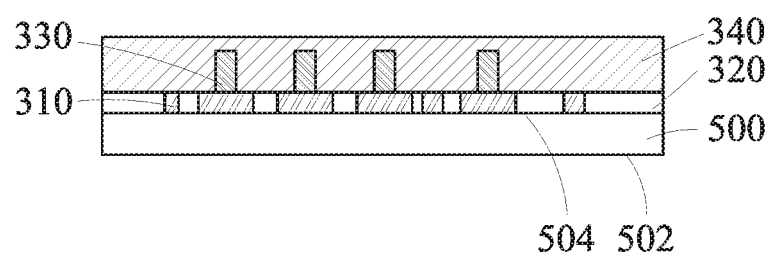
Figure 6I:
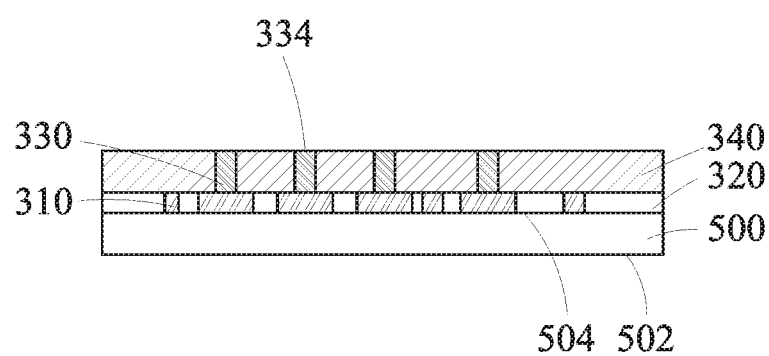
Figure 6J:
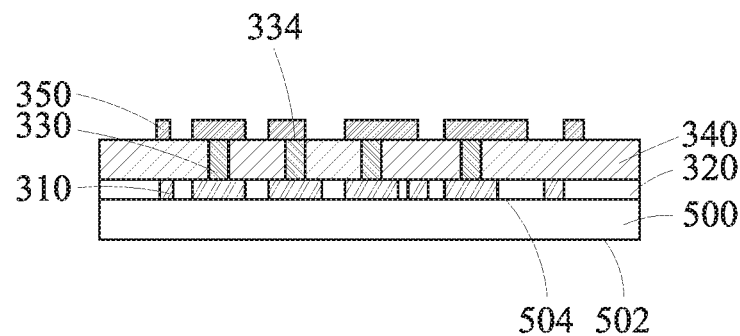
Figure 6K:
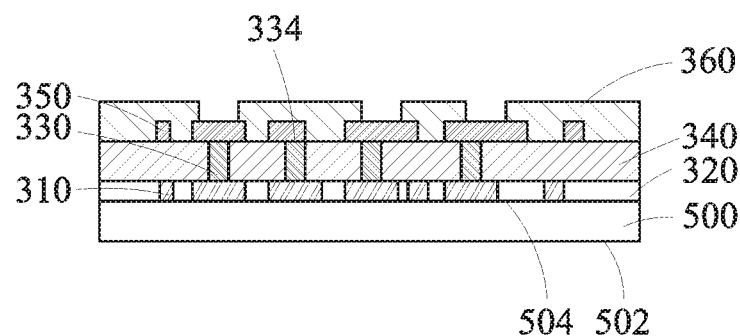
Figure 6L:
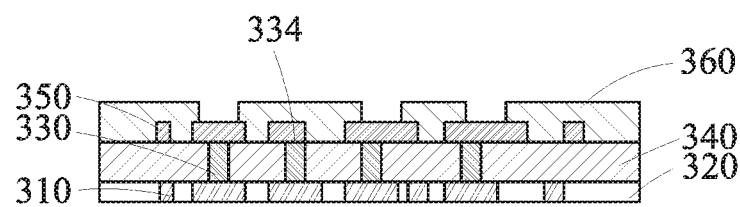
Figure 6M:
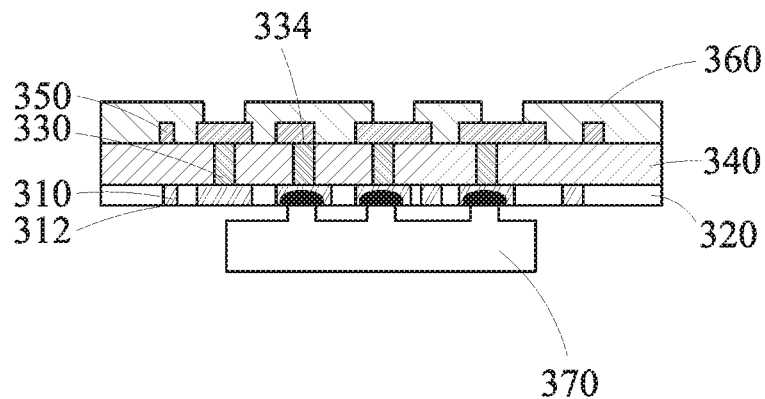
Figure 6N:
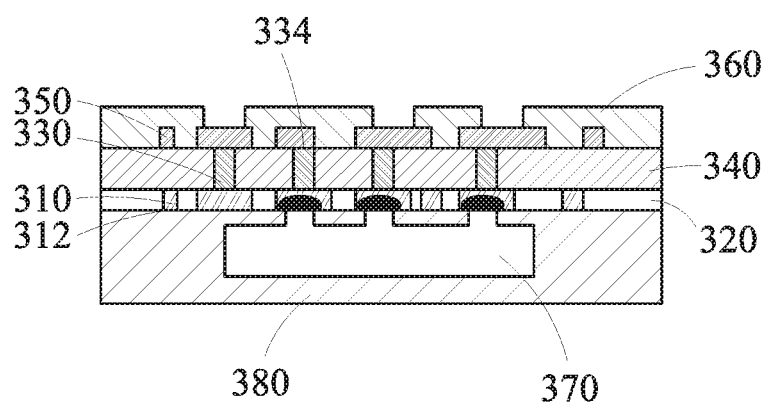
Figure 6O:
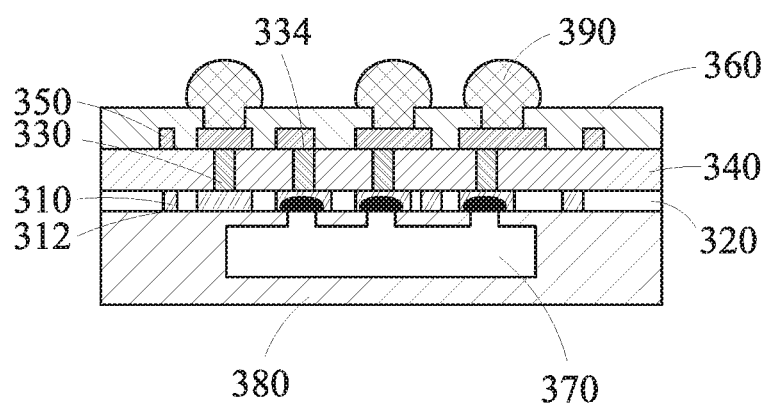
Figure 6P:
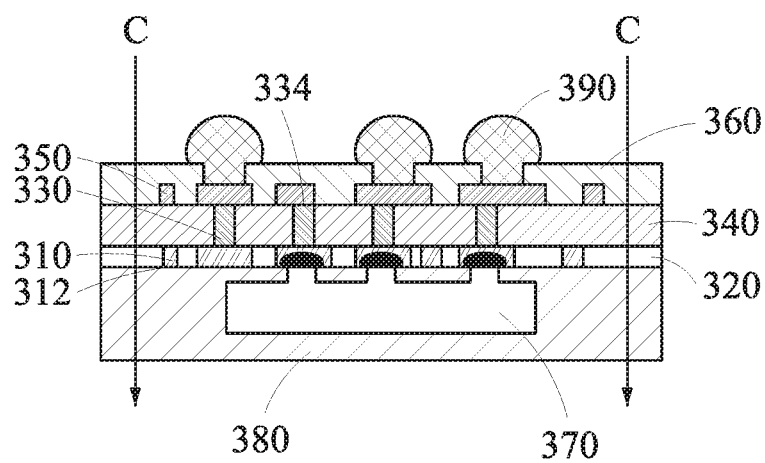

FIG. 5 is a flow chart depicting steps performing in a method for manufacturing a package apparatus of the first embodiment. FIG. 6A to FIG. 6P are schematic diagrams illustrating the manufacturing of a package apparatus of the first embodiment. As shown in FIG. 5, a method 80 for manufacturing the package apparatus 30 comprises the following steps:

step S802: providing a metal carrier 500 composed of a first side 502 and a second side 504 that are arranged opposite to each other, as shown in FIG. 6A;

step S804: forming a first dielectric material layer 320 and a first photoresist layer 510 respectively on the second side 504 of the metal carrier 500 and the first side 502 of the metal carrier 500, as shown in FIG. 6B, whereas the first dielectric material layer 320 is formed by first a coating process and then a photolithography and etching process, and the first photoresist layer 510 is formed by a dry-film lamination process or a liquid-coating process in this embodiment, whereas in another embodiment, the first photoresist layer 510 can be replaced by a temporary metal layer, organic protective layer, or directly by the use of the metal carrier 500, but is not limited thereby;

step S806: forming a first wiring layer 310 on the second side 504 of the metal carrier 500, as shown in FIG. 6C, whereas the first dielectric material layer 320 is disposed within a specific portion of the first wiring layer 310, and the first wiring layer 310 is formed using an electrolytic plating process in this embodiment, but is not limited thereby, and moreover, the first wiring layer 310 can be a wiring layer with patterns which includes at least one wire and a chip seat, and the first wiring layer 310 can be made of a metal, such as copper;

step S808: forming a second photoresist layer 520 on the first dielectric material layer 320 and the first wiring layer 310, as shown in FIG. 6D, whereas the second photoresist layer 520 can be formed using a dry-film lamination process or a liquid-coating process in this embodiment, but is not limited thereby;

step S810: removing a portion of the second photoresist layer 520 for exposing the first wiring layer 310, as shown in FIG. 6E, whereas the removal of a portion of the second photoresist layer 520 is performed using a photolithography process, but is not limited thereby;

step S812: forming a first conductive pillar layer 330 on the first wiring layer 310, as shown in FIG. 6F, whereas the first conductive pillar layer 330 is formed using an electrolytic plating process in this embodiment, but is not limited thereby, and moreover, the first conductive pillar layer 330 includes at least one conductive pillar that can be made of a metal, such as copper and is formed at a position corresponding to the wires and the chip seat of the first wiring layer 310;

step S814: removing the first photoresist layer 510 and the second photoresist layer 520 so as to allow respectively the first wiring layer 310 to exposed out of the second side 504 of the metal carrier 500, and also the first dielectric material layer 320 to exposed out of the second side 504 of the metal carrier 500, while enabling the first dielectric material layer 320 to be disposed within a specific portion of the first wiring layer 310 and enabling the first conductive pillar layer 330 to be formed on the first wiring layer 310, as shown in FIG. 6G;

step S816: forming a first buffer layer 340 for allowing the same to cover the first dielectric material layer 320, the first wiring layer 310, the first conductive pillar layer 330, and the second side 504 of the metal carrier 500, as shown in FIG. 6H, whereas, in this embodiment, the first buffer layer 340 is formed by a transfer molding process, a top molding process, a compression molding process an injection molding process, or a vacuum-press casting process, and can be made from a material selected from the group consisting of novolac-based resin, epoxy-based resin, silicon-based resign and other molding compounds, whichever can be heated to a liquid state so as to be poured on the second side 504 of the metal carrier 500 for allowing the same to cover the first dielectric material layer 320, the first wiring layer 310, the first conductive pillar layer 330 and the second side 504 of the metal carrier 500 under a high-temperature and high-pressure condition, and thereafter, to be cured into the first buffer layer 340, and moreover the first buffer layer 340 can be composed of a kind of filler, such as a powder silicon dioxide; and in another embodiment, the formation of the first buffer layer 340 can include the steps of: providing a molding compound to be heated to a liquid state, whereas the molding compound is composed of a resin and powder silicon dioxide; pouring the liquefied molding compound on the second side 504 of the metal carrier 500 while allowing the molding compound to cover the first dielectric material layer 320, the first wiring layer 310 and the first conductive pillar layer 330 under a high-temperature and high-pressure condition; and curing the molding compound for enabling the same to form the first buffer layer 340, but is not limited thereby;

step S818: enabling one end 334 of the first conductive pillar layer 330 to be exposed, as shown in FIG. 6I, whereas in this embodiment, the exposing of the end 334 of the first conductive pillar layer 330 is enabled by grinding and removing a portion of the first buffer layer 340, however, under ideal condition, the one end 334 of the first conductive pillar layer 330 is positioned coplanar with the first buffer layer 340, by that the exposing of the one end 334 of the first conductive pillar layer 330 can be achieved simultaneously with the formation of the first buffer layer 340, and thus the process for grinding and removing of the first buffer layer 340 can be avoided;

step S820: forming a second wiring layer 350 on the first buffer layer 340 and the exposed one end 334 of the first conductive pillar layer 330, as shown in FIG. 6J, whereas the second wiring layer 350 can be formed by the use of an electrolytic plating process, an electroless plating process, a sputtering coating process, or a thermal coating process, but is not limited thereby, and moreover, the second wiring layer 350 can be a wiring layer with patterns which includes at least one wire and is a layer formed at a position corresponding to the one end 334 of the first conductive pillar layer 330, moreover, the second wiring layer 350 can be made of a metal, such as copper;

step S822: forming a protection layer 360 on the first buffer layer 340 and the second wiring layer 350 while allowing a portion of the second wiring layer 350 to expose, as shown in FIG. 6K, whereas the protection layer 360 is used for insulating wires in the second wiring layer 350;

step S824: removing the metal carrier 500 for exposing the wires and the chip seat of the first wiring layer 310, as shown in FIG. 6L, whereas the removal of the metal carrier 500 can be performed using an etching process, or a debonding process, or even a physical process of grinding, but is not limited thereby;

step S826: providing an external component 370 to be disposed on and electrically connected to the first surface 312 of the first wiring layer 310, as shown in FIG. 6M, whereas, in an embodiment, the external component 370 can be an active component, a passive component, a semiconductor chip or a flexible circuit-board, but is not limited thereby;

step S828: forming an external molding compound layer 380 while allowing the same to cover the external component 370 and the first surface 312 of the first wiring layer 310, as shown in FIG. 6N, whereas, in this embodiment, the external molding compound layer 380 is formed by a process selected from the group consisting of: a transfer molding process, a top molding process, a compression molding process, an injection molding process and a vacuum casting molding process, and can be made from a material selected from the group consisting of novolac-based resin, epoxy-based resin, silicon-based resign and other molding compounds, whichever can be heated to a liquid state so as to be poured on and cover the external component 370 and the first surface 312 of the first wiring layer 310, under a high-temperature and high-pressure condition, and thereafter, to be cured into the external molding compound layer 380, and moreover the external molding compound layer 380 can be composed of a kind of filler, such as a powder silicon dioxide;

step S830: forming a plurality of conductive elements 390 on the second wiring layer 350, as shown in FIG. 6O, whereas each of the conductive elements 390 can be made of a metal, such as copper;

step S832: enabling a cutting process C to be performed upon at least one layer selected from the group consisting of: the first wiring layer 310, the dielectric material layer 320, the first conductive pillar layer 330, the first buffer layer 340, the second wiring layer 350, and the protection layer 360, as shown in FIG. 6P, by that a posterior package apparatus 40 of FIG. 4 can be achieved.

It is noted that the manufacturing methods regarding to the making of the package apparatuses shown in the second embodiments to the twenty-first embodiments are all similarly to the aforesaid method for making the package apparatus of the first embodiment, so that they are not described further herein.

To sum up, the package apparatus of the present invention employs both a molding compound layer and a dielectric material layer at the same time as the major material in the manufacturing of a coreless substrate, so that the shortcoming of easy-to-crack and break-into-pieces due to high rigidity that troubles the conventional substrate using single molding compound layer can be avoided, and moreover, by the use of a molded interconnection system (MIS) as well as an electrical connection using plating pillar conductive layer that are achieved during the substrate manufacturing process, a thin-type stacking structure with good rigidity can be achieved. In addition, by the additional second dielectric material layer or even the third dielectric material layer, the stability of the molding compound layer is enhanced, adapting the same for the manufacturing process of high-density multi-layered stacking structure of small line-width and small pitch.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:
1. A package apparatus, comprising:
a first wiring layer, having a first surface and a second surface, wherein the first surface and the second surface are disposed opposite to each other;
a first dielectric material layer, comprising one of a resin, a silicon nitride material, and a silicon oxide material, wherein the first wiring layer is disposed within the first dielectric material layer, and the first surface of the first wiring layer is exposed out of the first dielectric material layer for an electrical connection;
a first conductive pillar layer, disposed on the second surface of the first wiring layer;

a first buffer layer, disposed within the first conductive pillar layer, wherein the first buffer layer is disposed on the first dielectric material layer, and the first buffer layer is a molding compound material for chip packaging comprising one of a novolac-based resin, an epoxy-based resin, and a silicon-based resin;

a protection layer, disposed on the first buffer layer and a second wiring layer, wherein the protection layer is one of a solder resist layer, a photo-sensitive dielectric material layer, and a non-photo-sensitive dielectric material layer;

a second buffer layer, disposed between the first buffer layer and the protection layer, wherein the second buffer layer comprises a dielectric material;

the second wiring layer, disposed between the second buffer layer and the protection layer, wherein the second wiring layer extends and pass through the second buffer layer to connect to the first conductive pillar layer;

an external component, disposed on and electrically connected to the first surface of the first wiring layer, wherein the external component is selected from a group consisting of: an active component, a passive component, and a semiconductor chip;

an external molding compound layer, disposed on the external component and the first surface of the first wiring layer; and a plurality of conductive elements, disposed on the second wiring layer.

2. The package apparatus of claim 1, wherein the first conductive pillar layer further disposed on the first dielectric material layer, and the line width of the first conductive pillar layer is larger than the line width of the first wiring layer.

3. The package apparatus of claim 1, further comprising: a conductive layer, wherein the conductive layer is disposed on the first wiring layer and the first dielectric material layer, and the first conductive pillar layer is disposed between the conductive layer and the second wiring layer.

4. A package apparatus, comprising:
a first wiring layer, having a first surface and a second surface wherein the first surface and the second surface are disposed opposite to each other;
a first dielectric material layer, disposed within the first wiring layer, wherein the first dielectric material layer comprises one of a resin, a silicon nitride material, and a silicon oxide material;
a first conductive pillar layer, disposed on the second surface of the first wiring layer;
a first buffer layer, disposed within the first conductive pillar layer, wherein the first buffer layer is a molding compound material for chip packaging comprising one of a novolac-based resin, an epoxy-based resin, and a silicon-based resin;
a second wiring layer, disposed on the first buffer layer and one end of the first conductive pillar layer;
a protection layer, disposed on the first buffer layer and the second wiring layer, wherein the protection layer is one of a solder resist layer, a photo-sensitive dielectric material layer, and a non-photo-sensitive dielectric material layer;
a second buffer layer, wherein the second buffer layer is disposed on the first dielectric material layer, the first buffer layer is disposed between the second buffer layer and the protection layer, and the second buffer layer comprises a dielectric material;

a third buffer layer, wherein the third buffer layer comprises a dielectric material, the third buffer is disposed between the first buffer layer and the protection layer, and the second wiring layer extends and passes through the third buffer layer to connect to the first conductive pillar layer;
first conductive layer; and
a second conductive pillar layer, wherein the second conductive pillar layer is disposed on the first wiring layer and passes through the second buffer layer, the first conductive layer is disposed on the second buffer layer and connected to the second conductive pillar layer, the first conductive pillar layer is disposed between the first conductive layer and the second wiring layer.

5. The package apparatus of claim 4, further comprising:
a conductive layer, wherein the conductive layer is disposed on the first wiring layer and the first dielectric material layer, and the first conductive pillar layer is disposed between the conductive layer and the second wiring layer.

6. The package apparatus of claim 1, further comprising:
a first conductive layer; and
a second conductive pillar layer, wherein the first conductive layer is disposed between the first conductive pillar layer and the second conductive pillar layer, and the second conductive pillar layer is disposed between the first conductive layer and the second wiring layer.

7. The package apparatus of claim 1, further comprising:
a second buffer layer;
first conductive layer; and
a second conductive pillar layer;
wherein the second buffer layer is disposed on the first dielectric material layer, the first buffer layer is disposed between the second buffer layer and the protection layer, and the second buffer layer comprises a dielectric material; and
wherein the second conductive pillar layer is disposed on the first wiring layer and passes through the second buffer layer, the first conductive layer is disposed on the second buffer layer and connected to the second conductive pillar layer, the first conductive pillar layer is disposed between the first conductive layer and the second wiring layer.

8. The package apparatus of claim 7, further comprising:
a second conductive layer, wherein the second conductive layer is disposed between the first wiring layer and the second conductive pillar layer.

9. A package apparatus, comprising:
a first wiring layer, having a first surface and a second surface wherein the first surface and the second surface are disposed opposite to each other;
a first dielectric material layer, disposed within the first wiring layer, wherein the first dielectric material layer comprises one of a resin, a silicon nitride material, and a silicon oxide material;
a first conductive pillar layer, disposed on the second surface of the first wiring layer;
a first buffer layer, disposed within the first conductive pillar layer, wherein the first buffer layer is a molding compound material for chip packaging comprising one of a novolac-based resin, an epoxy-based resin, and a silicon-based resin;
a second wiring layer, disposed on the first buffer layer and one end of the first conductive pillar layer;
a protection layer, disposed on the first buffer layer and the second wiring layer, wherein the protection layer is one of a solder resist layer, a photo-sensitive dielectric material layer, and a non-photo-sensitive dielectric material layer;

a first conductive layer;

a second conductive pillar layer, wherein the first conductive layer is disposed between the first conductive pillar layer and the second conductive pillar layer, and the second conductive pillar layer is disposed between the first conductive layer and the second wiring layer;

a second buffer layer; and a third buffer layer;

wherein the first buffer is disposed on the first dielectric material layer, the second buffer layer is disposed between the first buffer layer and the third buffer layer, the third buffer layer is disposed between the second buffer layer and the protection layer, the third buffer layer comprises the molding compound material, and the second buffer comprises a dielectric material; and wherein the first conductive pillar layer is disposed on the first wiring layer and passes through the first buffer layer, the first conductive layer is disposed on the second buffer layer, the first conductive layer extends and passes through the second buffer layer to connect to the first conductive pillar layer, the second conductive pillar layer is disposed on the first conductive layer and passes through the third buffer layer to connect to the second wiring layer, and the second wiring layer is disposed on the third buffer layer and the second conductive pillar layer.

10. The package apparatus of claim 9, further comprising: a second conductive layer, wherein the second conductive layer is disposed between the first pillar conductive layer and the first wiring layer.

11. The package apparatus of claim 9, further comprising: a fourth buffer layer, the fourth buffer layer comprising the dielectric material, and the fourth buffer layer is disposed between the second wiring layer and the third buffer layer, the second wiring layer extends and passes through the fourth buffer layer to connect to the second conductive pillar layer.

12. The package apparatus of claim 11, further comprising: a second conductive layer, and the second conductive layer is between the first wiring layer and the first conductive pillar layer.

13. The package apparatus of claim 4, wherein the first conductive pillar layer further disposed on the first dielectric material layer, and the line width of the first conductive pillar layer is larger than the line width of the first wiring layer.

14. The package apparatus of claim 4, further comprising: a second conductive layer, wherein the second conductive layer disposed between the first wiring layer and the second conductive pillar layer.

* * * * *